United States Patent [19]

Thomas et al.

[11] 4,061,955
[45] Dec. 6, 1977

[54] MULTI-CELL BATTERY PROTECTION SYSTEM

[75] Inventors: Ralph D. Thomas, Cleveland; Nagle, William J., Avon Lake, both of Ohio

[73] Assignee: The United States of America as represented by the Administrator of the National Aeronautics and Space Administration, Washington, D.C.

[21] Appl. No.: 687,822

[22] Filed: May 19, 1976

[51] Int. Cl. ............................................. H02J 7/04
[52] U.S. Cl. ...................................... 320/6; 320/15; 320/18; 320/40
[58] Field of Search .................. 320/2, 15, 17, 18, 40, 320/48, 6, 7, 8, 13; 340/249

[56] References Cited

U.S. PATENT DOCUMENTS

| 3,343,058 | 9/1967 | Deschamps et al. | 320/40 X |
| 3,348,117 | 10/1967 | Howden | 320/18 |
| 3,496,442 | 2/1970 | Carlisle | 320/18 |
| 3,872,457 | 3/1975 | Ray | 320/48 X |

Primary Examiner—Robert J. Hickey
Attorney, Agent, or Firm—N. T. Musial; J. A. Mackin; John R. Manning

[57] ABSTRACT

A multi-cell battery protection system is provided wherein each cell has its own individual protective circuit. The protective circuits each comprise a solid state comparator unit and a high current switching device such as a relay. The comparator units each continuously monitor the associated cell and when the cell voltage either exceeds a predetermined "high" level or falls below a predetermined "low" level, the relay is actuated whereby a bypass circuit is completed across the cell thereby effectively removing the cell from the series of cells.

8 Claims, 1 Drawing Figure

U.S. Patent  Dec. 6, 1977  4,061,955
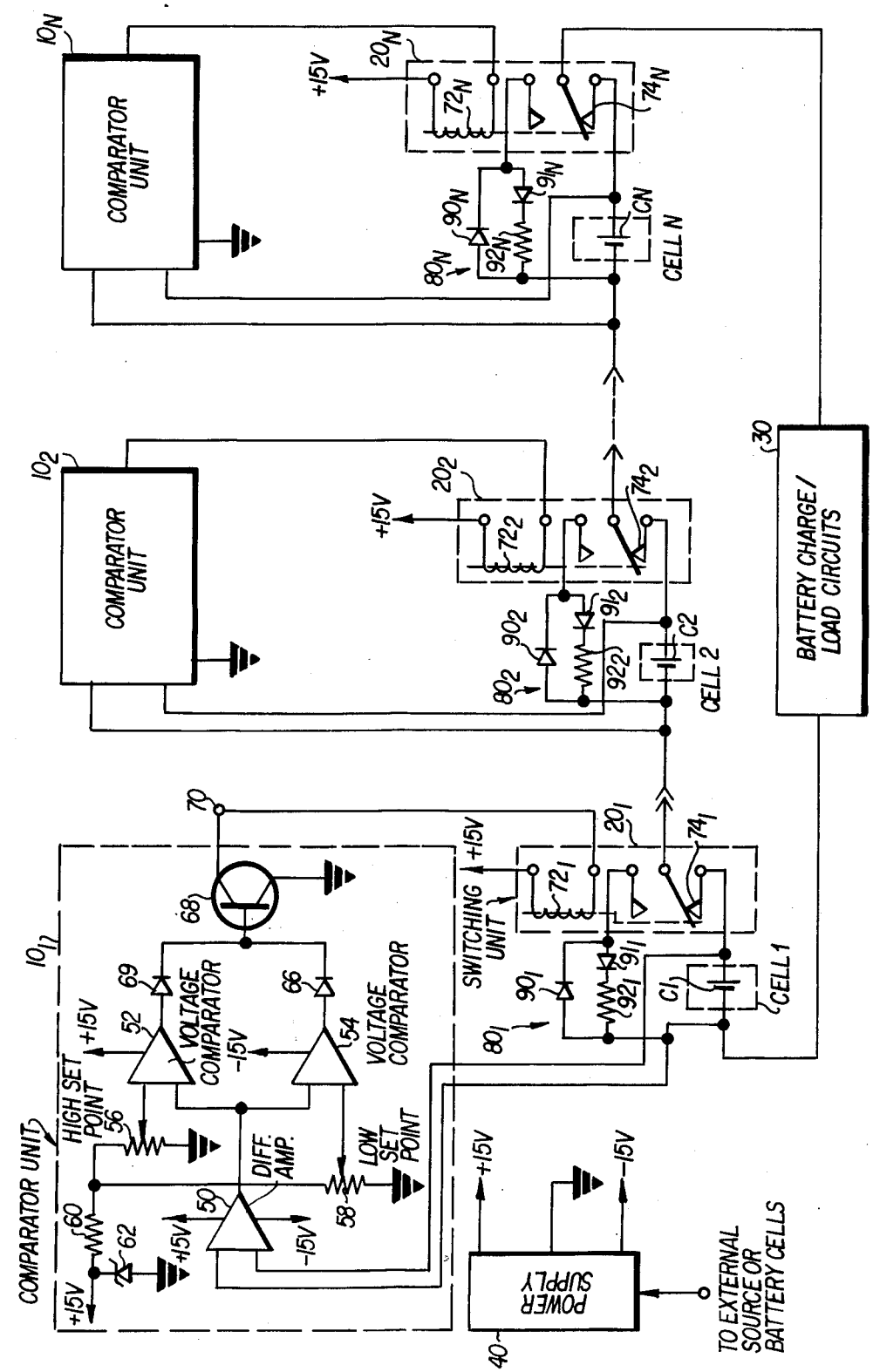

MULTI-CELL BATTERY PROTECTION SYSTEM

ORIGIN OF THE INVENTION

The invention described herein was made by employees of the United States Government and may be manufactured or used by or for the Government without the payment of any royalties thereon or therefor.

FIELD OF THE INVENTION

The present invention relates to protective circuits for batteries and more particular, to a protective system which includes individual protective circuits for each cell of a battery.

BACKGROUND OF THE INVENTION

The heightened concern in recent years regarding energy problems has lead to considerable research with respect to energy conservation and savings in the field of energy sources. One specific area of interest is that of improving primary sources such as electrical batteries and, in particular, increasing the life of such batteries for both terrestrial and space applications.

Batteries used in space flight applications, and sealed batteries in particular, require close monitoring to make certain they are in good working condition and that all cells thereof are operative. Moreover, the monitoring or protective circuitry utilized for this purpose should be as compact and lightweight as possible while still being totally reliable. For example, the use of meter-relay type monitoring units in large quantities so as to protect each cell under test is impractical in terms of cost and space requirements. Further, in many instances, total protection has not been obtainable without the necessity of resorting to highly sophisticated computer equipment.

Reference is made to U.S. Pat. Nos. 3,305,754 (Oakes et al); 3,470,441 (Ford et al); 3,707,664 (Esh) and 3,806,906 (Young), for examples of battery charging and monitoring systems of interest. The Ford et al patent discloses an automatic formation cycler and controller for electrochemical cells wherein an electromechanical stepping switch is used to sequentially connect the individual cells into a testing circuit wherein the output of the cell is compared with the high and low voltage levels during charging and discharging. The switch sequentially routes voltage samples from each individual cell to a single voltage detector which thus monitors all of the cells in sequence. The Esh patent is an example of systems wherein individual voltage sensitive relays are used, the relays in this case being employed to monitor selected cells having a charge capacity significantly lower than the non-monitored cells. The Young patent discloses a system which indicates the failure to properly conduct current of any cell in each bridge of an electric power converter, while the Oaks et al patent discloses a charging apparatus for multi-cell batteries which employs a stepping switch scanner and meter relay unit to sense individual cell voltages.

SUMMARY OF THE INVENTION

In accordance with the present invention, a protective system for a battery is provided which serves to extend the life of the battery for both terrestrial and space applications. The system includes a separate protective circuit for each cell of the battery so that continuous, totally uninterrupted protection is afforded. Although it has other applications, the device of the invention is particularly adapted for use in space flight applications and, to this end, the individual protective circuits are small, compact and lightweight particularly as compared with the relatively large and bulky meter-relay units which are conventionally used. As noted hereinbelow, the protective circuits each comprise a solid state voltage comparator and a higher current switching unit such as a relay and the two units can be combined into a single module which can be directly mounted on each cell of the battery as part of the cell or battery case construction.

According to a preferred embodiment thereof, a multi-cell battery protection system of the invention comprises a plurality of protective circuits equal in number to the number of cells of the battery, each protective circuit being associated with an individual cell and each comprising a solid state comparator circuit, connected across the corresponding cell, for sensing and comparing the cell voltage with a predetermined upper voltage level or limit and a predetermined lower voltage level or limit and for generating an output signal when the cell voltage is out of limits, i.e., above the upper level or below the lower level, and a control unit, corresponding to the high current switching unit referred to above, for controlling bypassing of the cell in question responsive to the output signal from the comparator circuit. The control unit preferably comprises a relay which is connected such that the out-of-limits cell is open circuited and effectively replaced preferably by a shorting bar or alternatively a cell voltage simulation circuit in the series of cells making up the battery. As soon as the cell returns to an in-limits condition, the bypass is removed and the cell is returned to service in the battery, regardless of whether the battery is in a charging or discharging mode of operation. Thus, no cell in the battery is ever permitted to be driven beyond the predetermined voltage limits.

The comparator circuit preferably comprises a differential amplifier connected across the corresponding cell, and first and second comparators each having one input connected to the output of the differential amplifier. The second input of the first comparator is connected to a potentiometer which provides a predetermined "high" reference voltage. Similarly, the second input of the second comparator is connected to a further potentiometer which provides a predetermined "low" reference voltage. A driver transistor connected to the comparator outputs is triggered when an out-of-limit voltage is sensed by either comparator.

Further comparing the protective system of the invention with prior art battery chargers and monitors, it is noted that use of an electromechanical stepping switch, such as disclosed in the Ford et al patent discussed above, is disadvantageous from several standpoints. For example, a system employing a stepping switch samples the cell voltages at a rate corresponding to the stepping rate of the switch and the number of cells in the battery, rather than providing continuous uninterrupted protection. Moreover, the noise levels associated with such stepping switches can trigger a switching level at a point which is higher or lower than a critical set-point. Additionally, the system of the invention can be set to continuously switch a cell into and out of the circuit (i.e., control the cell voltage relative to a given set-point) rather than simply locking that cell of the circuit. Further, a timing circuit prevents excessive relay contact wear and "chatter," in the control mode of the invention.

Other features and advantages of the invention will be set forth in, or apparent from, the detailed description of a preferred embodiment found hereinbelow.

BRIEF DESCRIPTION OF THE DRAWINGS

The single FIGURE in the drawings is a schematic circuit diagram of the multi-cell battery protection system of the invention.

DESCRIPTION OF THE PREFERRED EMBODIMENTS

The single figure in the drawings illustrates, in a schematic manner, a preferred embodiment of the battery protection system of the invention. It will be understood that the protection system can be used with a battery having any number of cells and a generalized "N-cell" system is illustrated.

The protection system basically comprises a plurality of comparator units, collectively denoted 10, and a plurality of switching units, collectively denoted 20, both equal in number to the cells of the battery. The cells are denoted $C_1, C_2 \ldots C_N$ and thus cell $C_1$, is protected by an individual comparator unit $10_1$ and an individual switching unit $20_1$, cell $C_2$ is protected by an individual comparator unit $10_2$ and an individual switching unit $20_2$, and so on, up to the general case where cell $C_N$ is protected by an individual comparator unit $10_N$ and an individual switching unit $20_N$.

Cells $C_1, C_2 \ldots C_N$ are connected across a battery charging and/or loading circuit indicated by block 30. The system is powered from a power supply 40 which converts the input power obtained from the system power bus or from an external power source into suitable supply voltages for the comparator units 10 and switching units 20. For some applications, wherein, for example, power is not readily available, it is preferable that the system power supply being powered directly from the battery itself.

Comparator units 10 are identical in construction and hence only comparator unit $10_1$ has been illustrated. Comparator unit $10_1$ includes a first operational amplifier 50 which is connected as differential amplifier across the positive and negative terminals of cell $C_1$. The output of differential amplifier 50 is connected to the positive input of a first operational amplifier 52 and to the negative input of a second operational amplifier 54. Operational amplifiers 52 and 54 function as voltage comparators, with comparator 52 comparing the output of differential amplifier 50 with a "high" set-point as determined by a first potentiometer 56 and comparator 54 comparing the output of differential amplifier 50 with a "low" set-point as determined by a second potentiometer 58. Potentiometers 56 and 58 are connected through a resistor 60 to the positive supply and a zener diode 62 connected between the positive supply and ground serves in stabilizing the supply. The outputs of comparators 52 and 54 are connected through respective diodes 64 and 66 to a driver transistor 68, the collector of which is connected to the output terminal 70 of comparator unit 10. When the voltage across cell $C_1$, as detected by differential amplifier 50, is greater than the predetermined "high" set voltage of potentiometer 56 or lower than the predetermined "low" set-point of potentiometer 58, transistor 68 will be switched on by the resultant output of comparator 52 or 54 and an output signal will appear at terminal 70.

The switching units 20 are also identical in construction and switching unit $20_1$ will be considered as exemplary. Switching unit $20_1$ includes a relay coil 72, which is connected to output terminal 70 of comparator unit 10, and which controls single-pole, double-throw relay contacts $74_1$ as is illustrated by the dashed line indicating a mechanical connection between the relay contacts $74_1$ and the armature of coil $72_1$.

Relay contacts $74_1$ are connected in series with a bypass circuit $80_1$ which is connected across cell $C_1$. Bypass circuit $80_1$ is normally open, with coil $72_1$ de-energized and relay contacts $74_1$ in the open position as illustrated. When coil $72_1$ is energized, relay contacts $74_1$ are closed and bypass circuit $80_1$ is connected in the system, thereby removing cell $C_1$ from the circuit and replacing the cell in the series of cells with a short circuit. Similar bypass circuits are provided for each of the other cells, as is indicated by circuits $80_2$ and $80_N$. Although the by-pass circuit $80_1 \ldots 80_N$ can simply comprise a shorting bar, the circuit may include a cell voltage simulating circuit (CVSC) comprising a diode $90_1$, connected in parallel with a serially connected diode $90_1$ and resistor $92_1$. This circuit prevents excess charging current from being supplied to the cells which make up a battery when one or more of the cells is by-passed or removed from the battery. This is particularly important where the charging current is tapered or reduced as the total battery voltage approaches its normal value. In such a situation, if one of the cells is bypassed, the total battery voltage will decrease. This causes the battery charger to increase the charging current at a time when the charging current should be decreasing.

With the cell simulating circuit, if the bypass contacts $80_1$ close while the battery is being charged, a voltage will appear across resistor $92_1$ due to charging current therethrough. The resistance of the resistor is selected so the voltage thereacross is close to that of the removed cell although this is dependent on charging current at the time the cell is bypassed. Thus, removal of the cell causes only a relatively small change in total battery voltage so that charging current does not increase excessively.

During times when the battery is supplying current to a load, the current passes through diode $90_1$ with negligible voltage drop if bypass contacts $90_1$ are closed. A cell voltage simulating circuit as just described is preferably provided for each cell so that, as illustrated, the system includes N circuits having diodes $90_1 \ldots 90_N$, $91_1 \ldots 91_N$ and resistors $92_1 \ldots 92_N$, where N is equal to the number of cells.

The overall operation of the system will be evident from the foregoing. Comparator 10 provides continuous monitoring of the individual cells associated therewith. When a cell produces an out-of-limit voltage, this is detected by the corresponding comparator 10, and the associated switching unit 20 is actuated so that the cell in question is bypassed. When the cell voltage returns to an in-limit level, switching unit 20 is de-energized and the bypass is removed so that the cell is restored to operation.

To provide isolation between the drive for the switching units and the comparator units, the output of the driver 68 may be coupled to winding 72 through the combination of light emitting diode (LED) and a photo-conductor.

Voltage comparator $10_1$ can readily be implemented using integrated circuit techniques and hence can be made to be very small and compact so that the circuit can be mounted directly on th corresponding cell. Thus, each cell is a complete self-protecting unit with respect to electrical parameters in question.

It will be appreciated that the protective system of the invention permits a battery to be discharged much "deeper," i.e., to a greater extent, without the danger of cell reversal and consequent explosion. Such a deeper discharge increases the useful energy that is available from a battery and therefore reduces the relative weight thereof.

Although the invention has been described relative to an exemplary embodiment thereof, it will be understood that other variations and modifications can be effected in this embodiment without departing from the scope and spirit of the invention.

We claim:

1. A protection system for a battery having a plurality of cells, said system comprising:

a plurality of protective circuits equal in number to the number of said cells, each said circuit being associated with an individual cell and each said circuit comprising solid state comparator means, connected across the corresponding cell, for continuously sensing and comparing the cell voltage with a predetermined upper voltage level and a predetermined lower voltage and for generating an output signal when said cell voltage is above said upper level or below said lower level, a normally open bypass circuit for bypassing said cell, control means responsive to said output signal for completing said bypass circuit to cause bypassing of said cell when the cell voltage is above said upper level or below said lower level, said bypass circuit comprising oppositely poled diodes connected in parallel and a resistor connected in series with one of said diodes.

2. A protection system as claimed in claim 1 wherein each said comparator means comprises an operational amplifier connected as a differential amplifier across the associated cell, first and second operational amplifier comparators each having a first input connected to the output of said differential amplifier, the second input of said first comparator being connected to a first voltage source providing said predetermined upper voltage level and the second input of said second comparator being connected to a second voltage source providing said predetermined lower voltage level.

3. A protection system as claimed in claim 2 wherein said first and second voltage sources comprise first and second potentiometers.

4. A protection system as claimed in claim 3 wherein said potentiometers are connected to a common supply terminal, said system further comprising a zener diode connected between said supply terminal and ground.

5. A protection system as claimed in claim 2 further comprising a transistor connected to the outputs of said comparators for controlling actuation of said control means.

6. A protection system as claimed in claim 1 further comprising means for connecting said voltage comparator means to said cells so as to provide power for said voltage comparator means.

7. A protection system as claimed in claim 1 wherein said comparator means includes a drive transistor which is switched on by said output signal and said control means comprising a relay energized by said drive transistor.

8. A protection system as claimed in claim 7 wherein said relay includes a coil connected in series with said drive transistor and normally open contacts connected in series with said bypass circuit.

* * * * *